US011158711B2

(12) United States Patent
Sharma et al.

(10) Patent No.: US 11,158,711 B2
(45) Date of Patent: Oct. 26, 2021

(54) AIR GAP FOR THIN FILM TRANSISTORS

(71) Applicant: Intel Corporation, Santa Clara, CA (US)

(72) Inventors: Abhishek A. Sharma, Hillsboro, OR (US); Van H. Le, Beaverton, OR (US); Li Huey Tan, Hillsboro, OR (US); Tristan Tronic, Aloha, OR (US); Benjamin Chu-Kung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/645,405

(22) PCT Filed: Dec. 27, 2017

(86) PCT No.: PCT/US2017/068578
§ 371 (c)(1),
(2) Date: Mar. 6, 2020

(87) PCT Pub. No.: WO2019/132895
PCT Pub. Date: Jul. 4, 2019

(65) Prior Publication Data
US 2020/0287006 A1 Sep. 10, 2020

(51) Int. Cl.
*H01L 29/417* (2006.01)
*H01L 29/66* (2006.01)
*H01L 29/786* (2006.01)

(52) U.S. Cl.
CPC .. *H01L 29/41733* (2013.01); *H01L 29/66742* (2013.01); *H01L 29/78696* (2013.01)

(58) Field of Classification Search
CPC ......... H01L 29/41733; H01L 29/66742; H01L 29/78696
(Continued)

(56) References Cited

U.S. PATENT DOCUMENTS

2005/0136598 A1* 6/2005 Bryant ................. B41J 2/14129
438/282
2009/0027604 A1 1/2009 Guo et al.
(Continued)

OTHER PUBLICATIONS

International Preliminary Report on Patentability for International Patent Application No. PCT/US2017/068578 dated Jul. 9, 2020, 13 pgs.
(Continued)

*Primary Examiner* — Tong-Ho Kim
(74) *Attorney, Agent, or Firm* — Schwabe, Williamson & Wyatt, P.C.

(57) ABSTRACT

Embodiments herein describe techniques for a thin-film transistor (TFT), which may include a gate electrode above a substrate and a channel layer above the gate electrode. A source electrode may be above the channel layer and adjacent to a source area of the channel layer, and a drain electrode may be above the channel layer and adjacent to a drain area of the channel layer. A passivation layer may be above the channel layer and between the source electrode and the drain electrode, and a top dielectric layer may be above the gate electrode, the channel layer, the source electrode, the drain electrode, and the passivation layer. In addition, an air gap may be above the passivation layer and below the top dielectric layer, and between the source electrode and the drain electrode. Other embodiments may be described and/or claimed.

25 Claims, 6 Drawing Sheets

(58) Field of Classification Search
USPC .......................................................... 257/288
See application file for complete search history.

(56) References Cited

U.S. PATENT DOCUMENTS

| | | |
|---|---|---|
| 2014/0167047 A1 | 6/2014 | Shieh et al. |
| 2016/0098965 A1 | 4/2016 | Chiu et al. |
| 2017/0263735 A1* | 9/2017 | Cheng .................... H01L 21/441 |
| 2020/0152635 A1* | 5/2020 | Sharma ............... H01L 27/0688 |

OTHER PUBLICATIONS

International Search Report and Written Opinion for International Patent Application No. PCT/US2017/068578 dated Sep. 21, 2018, 16 pgs.

* cited by examiner

AIR GAP FOR THIN FILM TRANSISTORS

CROSS-REFERENCE TO RELATED APPLICATION

This patent application is a U.S. National Phase Application under 35 U.S.C. § 371 of International Application No. PCT/US2017/068578, filed Dec. 27, 2017, entitled "AIR GAP FOR THIN FILM TRANSISTORS," which designates the United States of America, the entire disclosure of which is hereby incorporated by reference in its entirety and for all purposes.

FIELD

Embodiments of the present disclosure generally relate to the field of integrated circuits, and more particularly, to transistors.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays. However, a TFT in a back-gated architecture may suffer from a large capacitance penalty between a source electrode and a drain electrode. Such a large capacitance between a source electrode and a drain electrode of a TFT may negatively affect the operational speed, the energy consumption, and other aspects of performance of the TFT.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
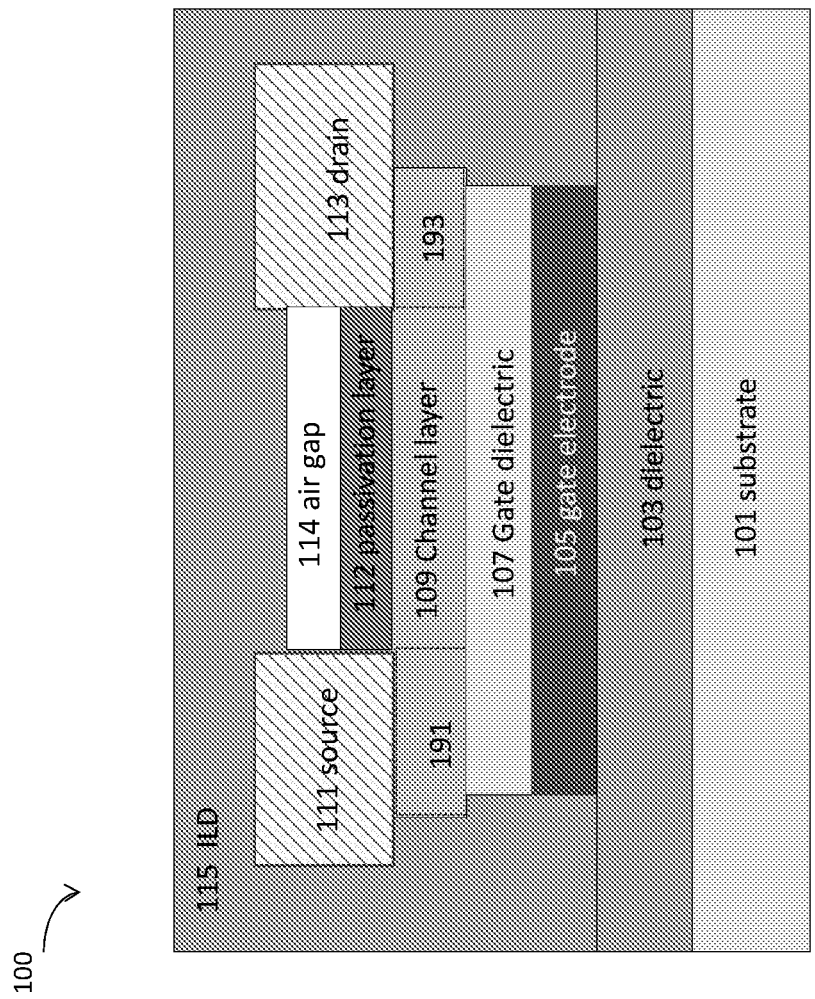
FIG. 1 schematically illustrates a diagram of a thin-film transistor (TFT) having an air gap between a source electrode and a drain electrode, in accordance with some embodiments.

Thin-film transistors (TFTs) may be fabricated in a back-gated or bottom gate architecture, where a gate electrode of a TFT may be patterned before a channel layer is patterned. Conventional TFTs in the back-gated architecture may have a large capacitance between a source electrode and a drain electrode. Embodiments herein may include an air gap between a source electrode and a drain electrode of a TFT. Due to a lower dielectric constant of the air compared to other dielectric materials, e.g., an oxide dielectric material or a nitride dielectric material, the TFT with an air gap may have lower capacitance between the source electrode and the drain electrode. As a result, the TFT may have improvements on the operational speed and the energy consumption of the TFT. In addition, the TFT may also have improved noise margin, and reduced unwanted interactions of oxide films over TFT channels. Furthermore, the TFT may have better stability.

Embodiments herein may present a TFT, which may include a gate electrode above a substrate and a channel layer above the gate electrode. A source electrode may be above the channel layer and adjacent to a source area of the channel layer, and a drain electrode may be above the channel layer and adjacent to a drain area of the channel layer. A passivation layer may be above the channel layer and between the source electrode and the drain electrode, and a top dielectric layer may be above the gate electrode, the channel layer, the source electrode, the drain electrode, and the passivation layer. In addition, an air gap may be above the passivation layer and below the top dielectric layer, and between the source electrode and the drain electrode.

Embodiments herein may present a method for forming a TFT. The method may include: forming a gate electrode above a substrate; forming a gate dielectric layer conformally covering the gate electrode; forming a channel layer above the gate dielectric layer; and forming a passivation layer above the channel layer. The method may further include: forming a hard mask layer covering a region of the passivation layer; forming a source electrode through the passivation layer above the channel layer and adjacent to a source area of the channel layer, wherein the source electrode is in contact with a side of the hard mask and a side of the passivation layer; forming a drain electrode through the passivation layer above the channel layer and adjacent to a drain area of the channel layer, wherein the drain electrode is in contact with another side of the hard mask and another side of the passivation layer; and forming a top dielectric layer above the gate dielectric layer, the channel layer, the source electrode, the drain electrode, and the hard mask layer. Furthermore, the method may include removing the hard mask layer below the top dielectric layer and above the passivation layer to form an air gap surrounded by the top dielectric layer, the passivation layer, the source electrode, and the drain electrode.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a storage cell, where the storage cell may have an electrode coupled to a source line of the memory array. The transistor in the memory cell may include a gate electrode coupled to a word line of the memory array, a source electrode coupled to a bit line of the memory array, and a drain electrode coupled to another electrode of the storage cell. A channel layer may be above the gate electrode, while the source electrode may be above the channel layer and adjacent to a source area of the channel layer, and the drain electrode above the channel layer and adjacent to a drain area of the channel layer. In addition, the transistor may include a passivation layer above the channel layer and between the source electrode and the drain electrode, and a top dielectric layer above the gate electrode, the channel layer, the source electrode, the drain electrode, and the passivation layer. Furthermore, an air gap may be above the passivation layer and below the top dielectric layer, and between the source electrode and the drain electrode.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of a TFT 100 having an air gap 114 between a source electrode 111 and a drain electrode 113, in accordance with some embodiments. For clarity, features of the TFT 100, the air gap 114, the source electrode 111, and the drain electrode 113, may be described below as examples for understanding an example TFT having an air gap between a source electrode and a drain electrode. It is to be understood that there may be more or fewer components within a TFT, an air gap, a source electrode, and a drain electrode. Further, it is to be understood that one or more of the components within a TFT, an air gap, a source electrode, and a drain electrode, may include additional and/or varying features from the description below, and may include any device that one having ordinary skill in the art would consider and/or refer to as a TFT, an air gap, a source electrode, and a drain electrode.

In embodiments, the TFT 100 may include the substrate 101, an ILD layer 103 above the substrate 101, and a gate electrode 105 above the ILD layer 103 and the substrate 101. A gate dielectric layer 107 may be above the gate electrode 105. A channel layer 109 may be above the gate electrode 105, and further above the gate dielectric layer 107. The channel layer 109 may include a source area 191 and a drain area 193. The source electrode 111 may be coupled to the source area 191, and the drain electrode 113 may be coupled to the drain area 193. A passivation layer 112 may be above the channel layer 109 and between the source electrode 111 and the drain electrode 113. A top dielectric layer 115 may be above the gate electrode 105, the channel layer 107, the source electrode 111, the drain electrode 113, and the passivation layer 112. Furthermore, the air gap 114 may be above the passivation layer 112 and below the top dielectric layer 115, and between the source electrode 111 and the drain electrode 113. In embodiments, the air gap 114 may have a thickness between the passivation layer 112 and the top dielectric layer 115 in a range of about 0.5 nanometers (nm) to about 20 nm.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 may include a silicon oxide (SiO) film, a silicon nitride (SiN) film, $O_3$-tetraethylorthosilicate (TEOS), $O_3$-hexamethyldisiloxane (HMDS), plasma-TEOS oxide layer, or other suitable materials.

In embodiments, the gate electrode 105, the source electrode 111, or the drain electrode 113, may be formed as a single layer or a stacked layer using one or more conductive films including a conductive material. For example, the gate electrode 105, the source electrode 111, or the drain electrode 113, may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. For example, the gate electrode 105, the source electrode 111, or the drain electrode 113, may include tantalum nitride (TaN), titanium nitride (TiN), iridium-tantalum alloy (Ir—Ta), indium-tin oxide (ITO), the like, and/or a combination thereof.

In embodiments, the gate dielectric layer 107 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 107 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($Ta_2O_5$), titanium dioxide ($TiO_2$), or other materials.

In embodiments, the channel layer 109 may include a material such as: indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide. The channel layer 109 may have a thickness in a range of about 10 nm to about 100 nm.

In embodiments, the passivation layer 112 may include oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

In embodiments, the top dielectric layer 115 may include silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

In embodiments, the passivation layer 112 and the top dielectric layer 115 may include dielectric materials that have a dielectric constant higher than the dielectric constant of the air. Hence, the air gap 114 above the passivation layer 112 and below the top dielectric layer 115, and between the source electrode 111 and the drain electrode 113 may reduce the capacitance between the source electrode 111 and the drain electrode 113. As a result, the TFT 100 may have an improved operational speed, improved noise margin, improved stability, and reduced energy consumption.

Figure 2:
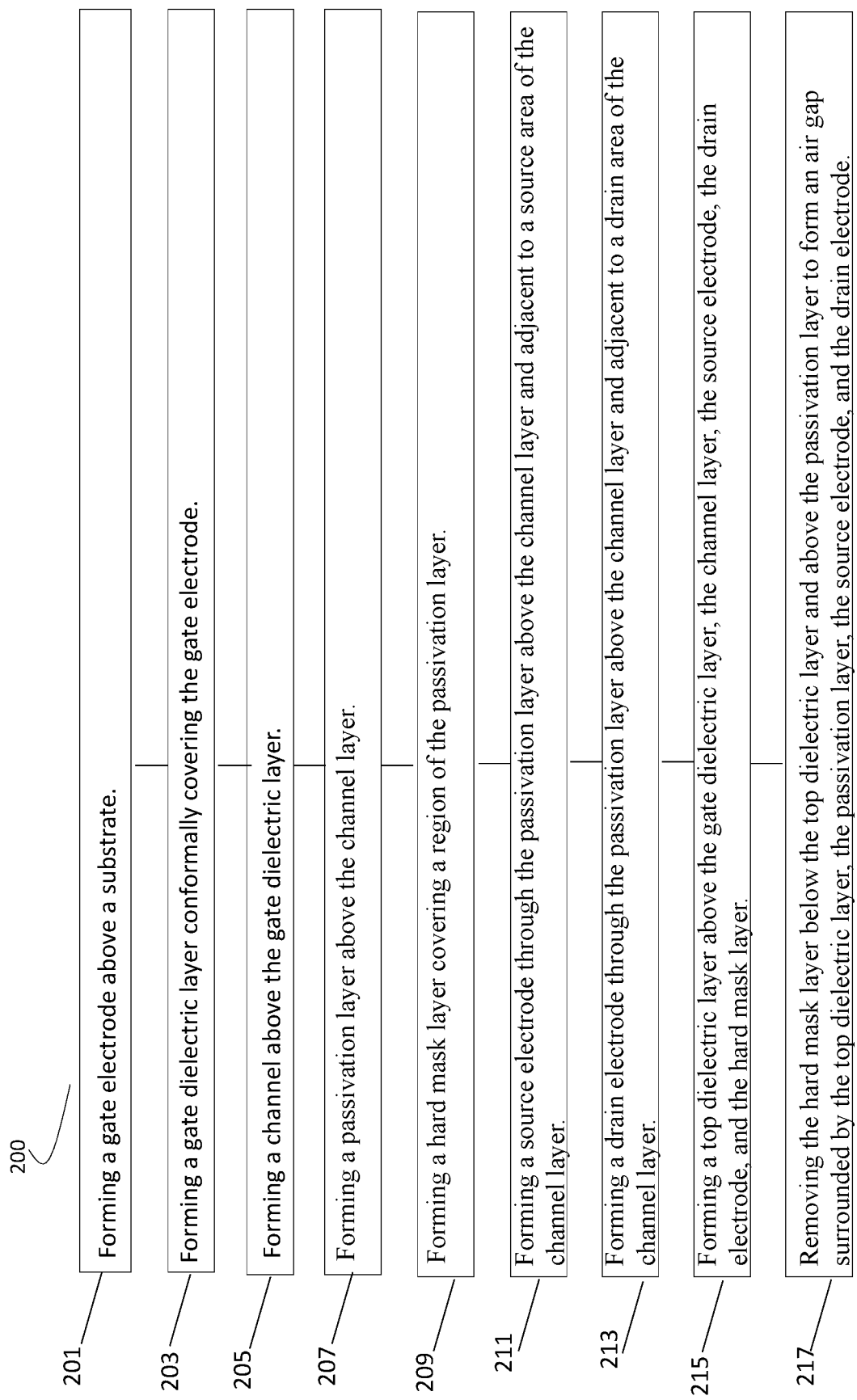
FIG. 2 illustrates a process for forming a TFT having an air gap between a source electrode and a drain electrode, in accordance with some embodiments.

FIG. 2 illustrates a process 200 for forming a TFT having an air gap between a source electrode and a drain electrode, in accordance with some embodiments. In embodiments, the process 200 may be applied to form the TFT 100 in FIG. 1.

At block 201, the process 200 may include forming a gate electrode above a substrate. For example, the process 200 may include forming the gate electrode 105 above the substrate 101 as shown in FIG. 1.

At block 203, the process 200 may include forming a gate dielectric layer conformally covering the gate electrode. For example, the process 200 may include forming the gate dielectric layer 107 conformally covering the gate electrode 105 as shown in FIG. 1.

At block 205, the process 200 may include forming a channel layer above the gate dielectric layer. For example, the process 200 may include forming the channel layer 109 above the gate dielectric layer 107, as shown in FIG. 1. The channel layer 109 may include the source area 191 and the drain area 193.

At block 207, the process 200 may include forming a passivation layer above the channel layer. For example, the process 200 may include forming the passivation layer 112 above the channel layer 109, as shown in FIG. 1.

At block 209, the process 200 may include forming a hard mask layer covering a region of the passivation layer. For example, the process 200 may include forming a hard mask layer covering the region of the passivation layer 112, where the hard mask layer may occupy the area for the air gap 114. In some embodiments, the hard mask layer may include at least one of boro-silicate glass, boro-phospho silicate glass, phospho silicate glass, TEOS oxide and silicon nitride.

At block 211, the process 200 may include forming a source electrode through the passivation layer above the channel layer and adjacent to a source area of the channel layer, where the source electrode is in contact with a side of the hard mask and a side of the passivation layer. For example, the process 200 may include forming the source electrode 111 through the passivation layer 112 above the channel layer 109 and adjacent to the source area 191 of the channel layer 109, where the source electrode 111 may be in contact with a side of the hard mask and a side of the passivation layer 112.

At block 213, the process 200 may include forming a drain electrode through the passivation layer above the channel layer and adjacent to a drain area of the channel layer, wherein the drain electrode is in contact with another side of the hard mask and another side of the passivation layer. For example, the process 200 may include forming the drain electrode 113 through the passivation layer 112 above the channel layer 109 and adjacent to the drain area 193 of the channel layer 109, where the drain electrode 113 may be in contact with another side of the hard mask and another side of the passivation layer 112.

At block 215, the process 200 may include forming a top dielectric layer above the gate dielectric layer, the channel layer, the source electrode, the drain electrode, and the hard mask layer. For example, the process 200 may include forming the top dielectric layer 115 above the gate dielectric layer 107, the channel layer 109, the source electrode 111, the drain electrode 113, and the hard mask layer that may occupy the area of the air gap 114.

At block 217, the process 200 may include removing the hard mask layer below the top dielectric layer and above the passivation layer to form an air gap surrounded by the top dielectric layer, the passivation layer, the source electrode, and the drain electrode. For example, the process 200 may include removing the hard mask layer below the top dielectric layer 115 and above the passivation layer 112 to form the air gap 114 surrounded by the top dielectric layer 115, the passivation layer 112, the source electrode 111, and the drain electrode 113.

In addition, the process 200 may include additional operations to form other layers, e.g., ILD layers, encapsulation layers, insulation layers, not shown.

Figure 3:
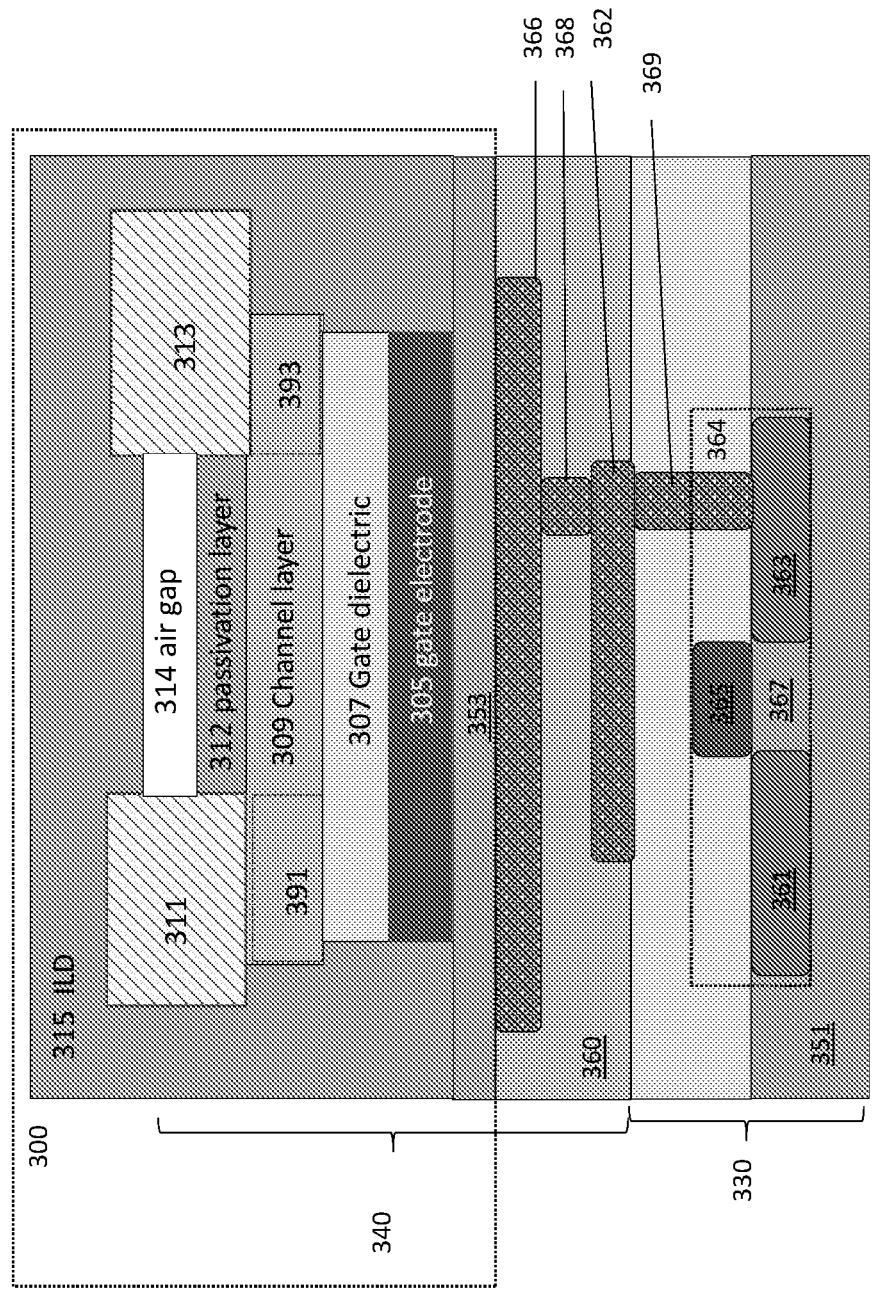
FIG. 3 schematically illustrates a diagram of a TFT having an air gap between a source electrode and a drain electrode and formed in back-end-of-line (BEOL) on a substrate, in accordance with some embodiments.

FIG. 3 schematically illustrates a diagram of a TFT 300 having an air gap 314 between a source electrode 311 and a drain electrode 313 and formed in back-end-of-line (BEOL) on a substrate 351, in accordance with some embodiments. The TFT 300 may be an example of the TFT 100 in FIG. 1. Various layers in the TFT 300 may be similar to corresponding layers in the TFT 100 in FIG. 1. The structure of the TFT 300 may be for illustration purpose only and is not limiting.

In embodiments, the TFT 300 may be formed on the substrate 351. The TFT 300 may include a gate electrode 305 above a ILD layer 353 and the substrate 351. A gate dielectric layer 307 may be above the gate electrode 305. A channel layer 309 may be above the gate electrode 305, and further above the gate dielectric layer 307. The channel layer 309 may include a source area 391 and a drain area 393. The source electrode 311 may be coupled to the source area 391, and the drain electrode 313 may be coupled to the drain area 393. A passivation layer 312 may be above the channel layer 309 and between the source electrode 311 and the drain electrode 313. A top dielectric layer 315 may be above the gate electrode 305, the channel layer 307, the source electrode 311, the drain electrode 313, and the passivation layer 312. Furthermore, the air gap 314 may be above the passivation layer 312 and below the top dielectric layer 315, and between the source electrode 311 and the drain electrode 313.

In embodiments, the TFT 300 may be formed at the BEOL 340. In addition to the TFT 300, the BEOL 340 may further include a dielectric layer 360, where one or more vias, e.g., a via 368, may be connected to one or more interconnect, e.g., an interconnect 366, and an interconnect 362 within the dielectric layer 360. In embodiments, the interconnect 366 and the interconnect 362 may be of different metal layers at the BEOL 340. The dielectric layer 360 is shown for example only. Although not shown by FIG. 3, in various embodiments there may be multiple dielectric layers included in the BEOL 340.

In embodiments, the BEOL 340 may be formed on the front-end-of-line (FEOL) 330. The FEOL 330 may include the substrate 351. In addition, the FEOL 330 may include other devices, e.g., a transistor 364. In embodiments, the transistor 364 may be a FEOL transistor, including a source 361, a drain 363, and a gate 365, with a channel 367 between the source 361 and the drain 363 under the gate 365. Furthermore, the transistor 364 may be coupled to interconnects, e.g., the interconnect 362, through a via 369.

Figure 4:
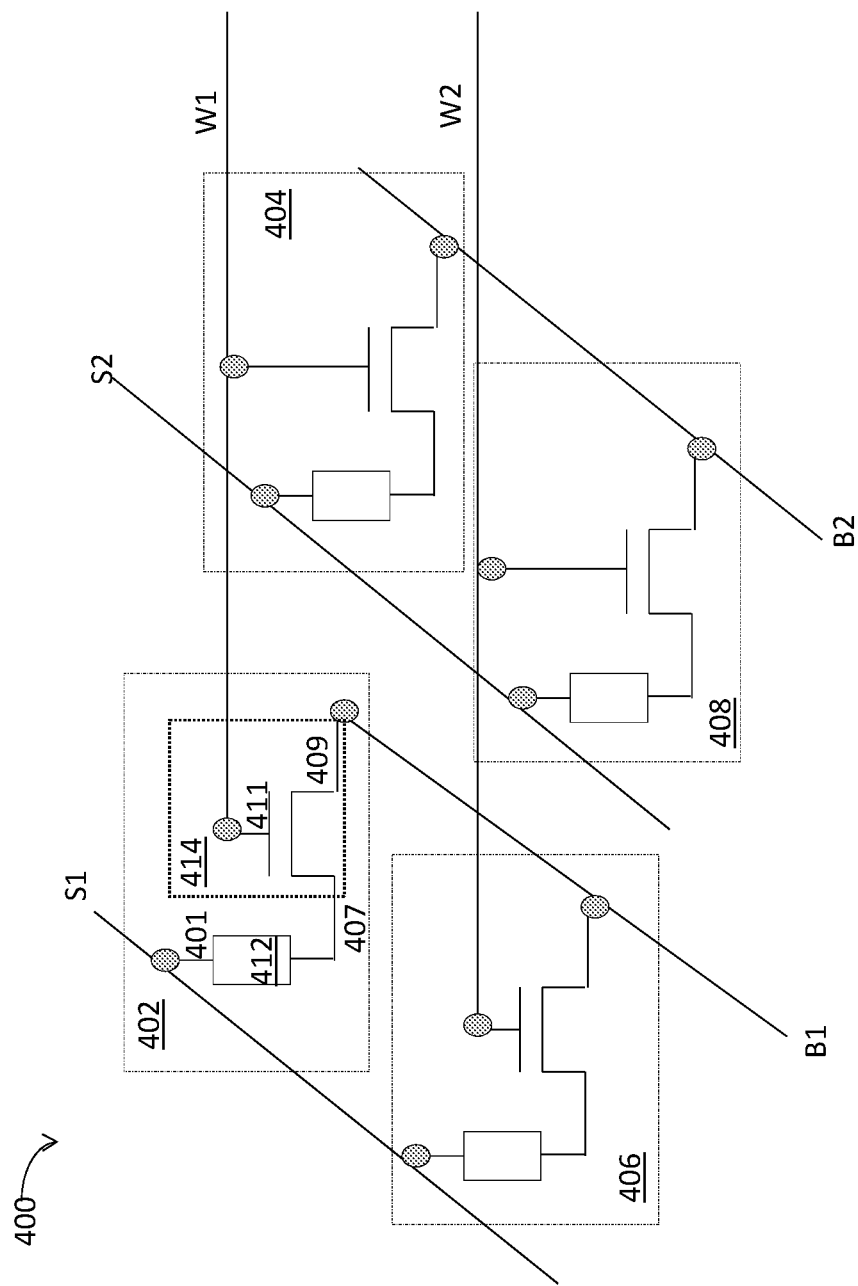
FIG. 4 schematically illustrates a memory array with multiple memory cells, where a TFT may be a selector of a memory cell, in accordance with some embodiments.

FIG. 4 schematically illustrates a memory array 400 with multiple memory cells (e.g., a memory cell 402, a memory cell 404, a memory cell 406, and a memory cell 408), where a TFT, e.g., a TFT 414, may be a selector of a memory cell, e.g., the memory cell 402, in accordance with various embodiments. In embodiments, the TFT 414 may be an example of the TFT 100 in FIG. 1. The TFT 414 may include a gate electrode 411 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 402 may be coupled in series with the other memory cells of the same row, and may be coupled in parallel with the memory cells of the other rows. The memory array 400 may include any suitable number of one or more memory cells.

In embodiments, multiple memory cells, such as the memory cell 402, the memory cell 404, the memory cell 406, and the memory cell 408, may have a similar configuration. For example, the memory cell 402 may include the TFT 414 coupled to a storage cell 412 that may be a capacitor, which may be called a 1T1C configuration. The memory cell 402 may be controlled through multiple electrical connections to read from the memory cell, write to the memory cell, and/or perform other memory operations. In some embodiments, the storage cell 412 may be another type of storage device, e.g., a resistive random access memory (RRAM) cell.

The TFT 414 may be a selector for the memory cell 402. A word line W1 of the memory array 400 may be coupled to a gate electrode 411 of the TFT 414. When the word line W1 is active, the TFT 414 may select the storage cell 412. A source line S1 of the memory array 400 may be coupled to an electrode 401 of the storage cell 412, while another electrode 407 of the storage cell 412 may be shared with the TFT 414. In addition, a bit line B1 of the memory array 400 may be coupled to another electrode, e.g., an electrode 409 of the TFT 414. The shared electrode 407 may be a source electrode or a drain electrode of the TFT 414, while the electrode 409 may be a drain electrode or a source electrode of the TFT 414. A drain electrode and a source electrode may be used interchangeably herein. Additionally, a source line and a bit line may be used interchangeably herein.

In various embodiments, the memory cells and the transistors, e.g., the memory cell 402 and the TFT 414, included in the memory array 400 may be formed in BEOL, as shown in FIG. 4. For example, the TFT 414 may be illustrated as the TFT 300 shown in FIG. 3 at the BEOL. Accordingly, the memory array 400 may be formed in higher metal layers, e.g., metal layer 3 and/or metal layer 4, of the integrated circuit above the active substrate region, and may not occupy the active substrate area that is occupied by conventional transistors or memory devices.

Figure 5:
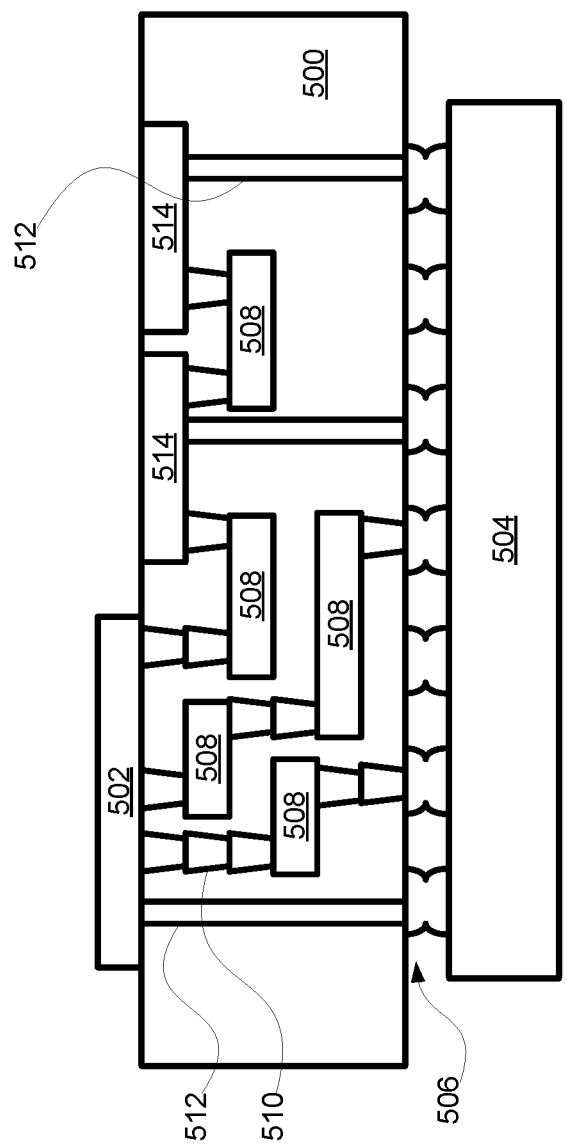
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for a TFT, e.g., the TFT 100 shown in FIG. 1 or the TFT 300 shown in FIG. 3. The second substrate 504 may be, for instance, a memory module, a computer motherboard, or another integrated circuit die. For example, the second substrate 504 may be a memory module including the memory array 400 as shown in FIG. 4. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500.

In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
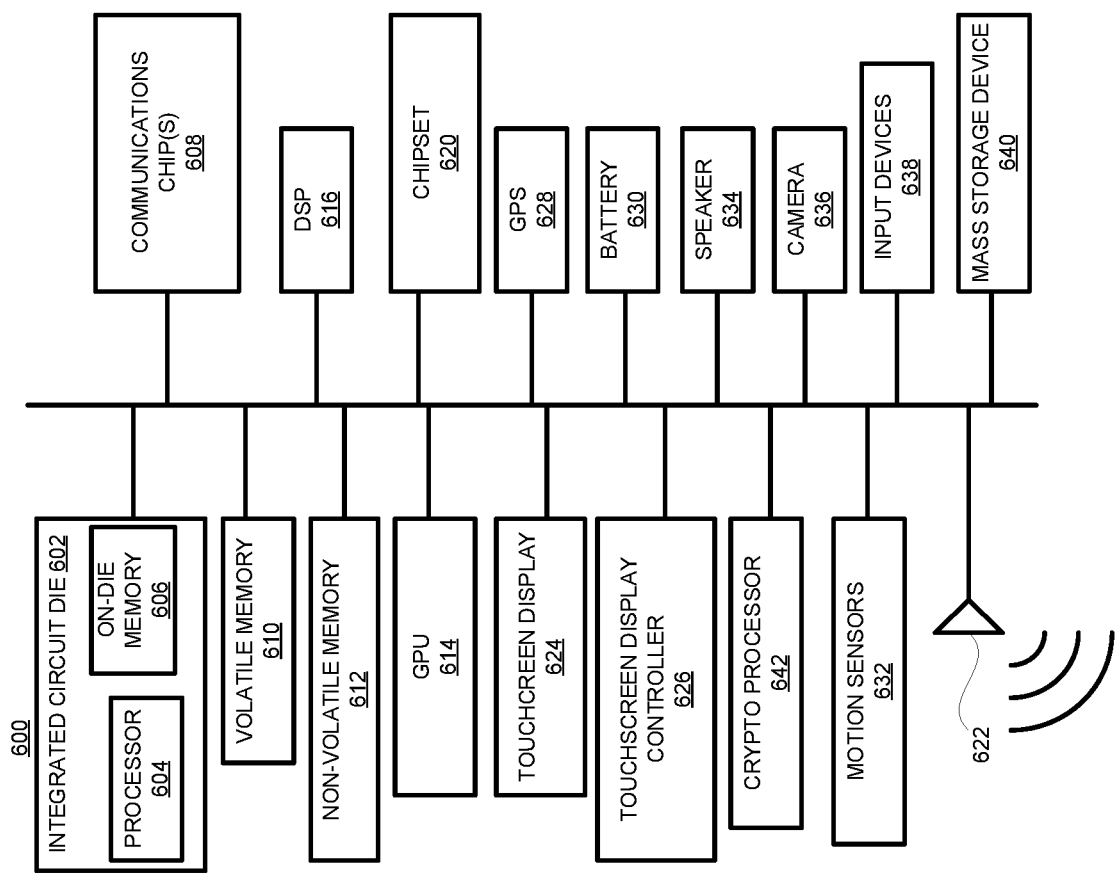
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include the TFT 100 shown in FIG. 1, the TFT 300 shown in FIG. 3, or a TFT formed according to the process 200 shown in FIG. 2.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others. For example, the touchscreen display 624 may include the TFT 100 shown in FIG. 1, the TFT 300 shown in FIG. 3, or a TFT formed according to the process 200 shown in FIG. 2.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the TFT 100 shown in FIG. 1, the TFT 300 shown in FIG. 3, or a TFT formed according to the process 200 shown in FIG. 2.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a thin film transistor (TFT), comprising: a gate electrode above a substrate; a channel layer above the gate electrode; a source electrode above the channel layer and adjacent to a source area of the channel layer; a drain electrode above the channel layer and adjacent to a drain area of the channel layer; a passivation layer above the channel layer and between the source electrode and the drain electrode; a top dielectric layer above the gate electrode, the channel layer, the source electrode, the drain electrode, and the passivation layer; and an air gap above the passivation layer and below the top dielectric layer, and between the source electrode and the drain electrode.

Example 2 may include the TFT of example 1 and/or some other examples herein, wherein the air gap has a thickness between the passivation layer and the top dielectric layer in a range of about 0.5 nanometers (nm) to about 20 nm.

Example 3 may include the TFT of any one of examples 1-2 and/or some other examples herein, wherein the channel layer includes indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

Example 4 may include the TFT of any one of examples 1-2 and/or some other examples herein, wherein the gate electrode, the source electrode, or the drain electrode includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, TiAlN, HfAlN, or InAlO.

Example 5 may include the TFT of any one of examples 1-2 and/or some other examples herein, wherein the substrate includes a silicon substrate, a glass substrate, a metal substrate, or a plastic substrate.

Example 6 may include the TFT of any one of examples 1-2 and/or some other examples herein, wherein the passivation layer includes oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

Example 7 may include the TFT of any one of examples 1-2 and/or some other examples herein, wherein the top dielectric layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

Example 8 may include the TFT of any one of examples 1-2 and/or some other examples herein, further comprising: a gate dielectric layer above the gate electrode and below the channel layer, wherein the gate dielectric layer includes silicon and oxygen; silicon and nitrogen; yttrium and oxygen; silicon, oxygen, and nitrogen; aluminum and oxygen; hafnium and oxygen; tantalum and oxygen; or titanium and oxygen.

Example 9 may include the TFT of any one of examples 1-2 and/or some other examples herein, further comprising: an interlayer dielectric (ILD) layer above the substrate and below the gate electrode.

Example 10 may include the TFT of any one of examples 1-2 and/or some other examples herein, wherein the TFT is above an interconnect that is above the substrate.

Example 11 may include a method for forming a thin film transistor (TFT), the method comprising: forming a gate electrode above a substrate; forming a gate dielectric layer conformally covering the gate electrode; forming a channel layer above the gate dielectric layer; forming a passivation layer above the channel layer; forming a hard mask layer covering a region of the passivation layer; forming a source electrode through the passivation layer above the channel layer and adjacent to a source area of the channel layer, wherein the source electrode is in contact with a side of the hard mask and a side of the passivation layer; forming a drain electrode through the passivation layer above the channel layer and adjacent to a drain area of the channel layer, wherein the drain electrode is in contact with another side of the hard mask and another side of the passivation layer; forming a top dielectric layer above the gate dielectric layer, the channel layer, the source electrode, the drain electrode, and the hard mask layer; removing the hard mask layer below the top dielectric layer and above the passivation layer to form an air gap surrounded by the top dielectric layer, the passivation layer, the source electrode, and the drain electrode.

Example 12 may include the method of example 11 and/or some other examples herein, wherein the removing the hard mask layer includes removing the hard mask layer by selective etching.

Example 13 may include the method of any one of examples 11-12 and/or some other examples herein, wherein the air gap has a thickness between the passivation layer and the top dielectric layer in a range of about 0.5 nanometers (nm) to about 20 nm.

Example 14 may include the method of any one of examples 11-12 and/or some other examples herein, wherein the channel layer includes indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

Example 15 may include the method of any one of examples 11-12 and/or some other examples herein, wherein the gate electrode, the source electrode, or the drain electrode includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al Ni, Cu, Cr, TiAlN, HfAlN, or InAlO.

Example 16 may include the method of any one of examples 11-12 and/or some other examples herein, the passivation layer includes oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

Example 17 may include the method of any one of examples 11-12 and/or some other examples herein, wherein the top dielectric layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

Example 18 may include a computing device, comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a gate electrode coupled to a word line of the memory array; a channel layer above the gate electrode; a source electrode above the channel layer, adjacent to a source area of the channel layer, and coupled to a bit line of the memory array; a drain electrode above the channel layer, adjacent to a drain area of the channel layer, and coupled to a first electrode of the storage cell; a passivation layer above the channel layer and between the source electrode and the drain electrode; a top dielectric layer above the gate electrode, the channel layer, the source electrode, the drain electrode, and the passivation layer; and an air gap above the passivation layer and below the top dielectric layer, and between the source electrode and the drain electrode; and the storage cell further includes a second electrode coupled to a source line of the memory array.

Example 19 may include the computing device of example 18 and/or some other examples herein, wherein the air gap has a thickness between the passivation layer and the top dielectric layer in a range of about 0.5 nanometers (nm) to about 20 nm.

Example 20 may include the computing device of any one of examples 18-19 and/or some other examples herein, wherein the channel layer includes indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

Example 21 may include the computing device of any one of examples 18-19 and/or some other examples herein, wherein the gate electrode, the source electrode, or the drain electrode includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al Ni, Cu, Cr, TiAlN, HfAlN, or InAlO.

Example 22 may include the computing device of any one of examples 18-19 and/or some other examples herein, wherein the passivation layer includes oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

Example 23 may include the computing device of any one of examples 18-19 and/or some other examples herein, wherein the top dielectric layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

Example 24 may include the computing device of any one of examples 18-19 and/or some other examples herein, wherein the transistor is above an interconnect that is above a substrate.

Example 25 may include the computing device of any one of examples 18-19 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Example 26 may include one or more computer-readable media having instructions for forming a thin film transistor (TFT), upon execution of the instructions by one or more processors, to perform the method of any one of examples 11-17.

Example 27 may include an apparatus for forming a thin film transistor (TFT), comprising: means for forming a gate electrode above a substrate; means for forming a gate dielectric layer conformally covering the gate electrode; means for forming a channel layer above the gate dielectric layer; means for forming a passivation layer above the channel layer; means for forming a hard mask layer covering a region of the passivation layer; means for forming a source electrode through the passivation layer above the channel layer and adjacent to a source area of the channel layer, wherein the source electrode is in contact with a side of the hard mask and a side of the passivation layer; means for forming a drain electrode through the passivation layer above the channel layer and adjacent to a drain area of the channel layer, wherein the drain electrode is in contact with another side of the hard mask and another side of the passivation layer; means for forming a top dielectric layer above the gate dielectric layer, the channel layer, the source electrode, the drain electrode, and the hard mask layer; and means for removing the hard mask layer below the top dielectric layer and above the passivation layer to form an air gap surrounded by the top dielectric layer, the passivation layer, the source electrode, and the drain electrode.

Example 28 may include the apparatus of example 27 and/or some other examples herein, wherein the removing the hard mask layer includes removing the hard mask layer by selective etching.

Example 29 may include the apparatus of any one of examples 27-28 and/or some other examples herein, wherein the air gap has a thickness between the passivation layer and the top dielectric layer in a range of about 0.5 nanometers (nm) to about 20 nm.

Example 30 may include the apparatus of any one of examples 27-28 and/or some other examples herein, wherein the channel layer includes indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

Example 31 may include the apparatus of any one of examples 27-28 and/or some other examples herein, wherein the gate electrode, the source electrode, or the drain electrode includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al Ni, Cu, Cr, TiAlN, HfAlN, or InAlO.

Example 32 may include the apparatus of any one of examples 27-28 and/or some other examples herein, the passivation layer includes oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

Example 33 may include the apparatus of any one of examples 27-28 and/or some other examples herein, wherein the top dielectric layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A thin film transistor (TFT), comprising:
   a gate electrode above a substrate;
   a channel layer above the gate electrode;
   a source electrode above the channel layer and adjacent to a source area of the channel layer, the source electrode having an uppermost surface;
   a drain electrode above the channel layer and adjacent to a drain area of the channel layer, the drain electrode having an uppermost surface;
   a passivation layer above the channel layer and between the source electrode and the drain electrode;
   a top dielectric layer above the gate electrode, the channel layer, the source electrode, the drain electrode, and the passivation layer; and
   an air gap above the passivation layer and below the top dielectric layer, and between the source electrode and the drain electrode, the air gap having an uppermost surface below the uppermost surface of the source electrode and below the uppermost surface of the drain electrode.

2. The TFT of claim 1, wherein the air gap has a thickness between the passivation layer and the top dielectric layer in a range of about 0.5 nanometers (nm) to about 20 nm.

3. The TFT of claim 1, wherein the channel layer includes indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

4. The TFT of claim 1, wherein the gate electrode, the source electrode, or the drain electrode includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, TiAlN, HfAlN, or InAlO.

5. The TFT of claim 1, wherein the substrate includes a silicon substrate, a glass substrate, a metal substrate, or a plastic substrate.

6. The TFT of claim 1, wherein the passivation layer includes oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

7. The TFT of claim 1, wherein the top dielectric layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

8. The TFT of claim 1, further comprising:
a gate dielectric layer above the gate electrode and below the channel layer, wherein the gate dielectric layer includes silicon and oxygen; silicon and nitrogen; yttrium and oxygen; silicon, oxygen, and nitrogen; aluminum and oxygen; hafnium and oxygen; tantalum and oxygen; or titanium and oxygen.

9. The TFT of claim 1, further comprising:
an interlayer dielectric (ILD) layer above the substrate and below the gate electrode.

10. The TFT of claim 1, wherein the TFT is above an interconnect that is above the substrate.

11. A method for forming a thin film transistor (TFT), the method comprising:
forming a gate electrode above a substrate;
forming a gate dielectric layer conformally covering the gate electrode;
forming a channel layer above the gate dielectric layer;
forming a passivation layer above the channel layer;
forming a hard mask layer covering a region of the passivation layer;
forming a source electrode through the passivation layer above the channel layer and adjacent to a source area of the channel layer, wherein the source electrode is in contact with a side of the hard mask and a side of the passivation layer;
forming a drain electrode through the passivation layer above the channel layer and adjacent to a drain area of the channel layer, wherein the drain electrode is in contact with another side of the hard mask and another side of the passivation layer;
forming a top dielectric layer above the gate dielectric layer, the channel layer, the source electrode, the drain electrode, and the hard mask layer; and
removing the hard mask layer below the top dielectric layer and above the passivation layer to form an air gap surrounded by the top dielectric layer, the passivation layer, the source electrode, and the drain electrode.

12. The method of claim 11, wherein the removing the hard mask layer includes removing the hard mask layer by selective etching.

13. The method of claim 11, wherein the air gap has a thickness between the passivation layer and the top dielectric layer in a range of about 0.5 nanometers (nm) to about 20 nm.

14. The method of claim 11, wherein the channel layer includes indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

15. The method of claim 11, wherein the gate electrode, the source electrode, or the drain electrode includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al Ni, Cu, Cr, TiAlN, HfAlN, or InAlO.

16. The method of claim 11, the passivation layer includes oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

17. The method of claim 11, wherein the top dielectric layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

18. A computing device, comprising:
a circuit board; and
a memory device coupled to the circuit board and including a memory array, wherein the memory array includes a plurality of memory cells, a memory cell of the plurality of memory cells includes a transistor and a storage cell, and wherein the transistor includes:
a gate electrode coupled to a word line of the memory array;
a channel layer above the gate electrode;
a source electrode above the channel layer, adjacent to a source area of the channel layer, and coupled to a bit line of the memory array;
a drain electrode above the channel layer, adjacent to a drain area of the channel layer, and coupled to a first electrode of the storage cell;
a passivation layer above the channel layer and between the source electrode and the drain electrode;
a top dielectric layer above the gate electrode, the channel layer, the source electrode, the drain electrode, and the passivation layer; and
an air gap above the passivation layer and below the top dielectric layer, and between the source electrode and the drain electrode; and
the storage cell further includes a second electrode coupled to a source line of the memory array.

19. The computing device of claim 18, wherein the air gap has a thickness between the passivation layer and the top dielectric layer in a range of about 0.5 nanometers (nm) to about 20 nm.

20. The computing device of claim 18, wherein the channel layer includes indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

21. The computing device of claim 18, wherein the gate electrode, the source electrode, or the drain electrode includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al Ni, Cu, Cr, TiAlN, HfAlN, or InAlO.

22. The computing device of claim 18, wherein the passivation layer includes oxide or nitride of silicon (Si), germanium (Ge), aluminum (Al), gallium (Ga), zirconium (Zr), yttrium (Y), hafnium (Hf), vanadium (V), magnesium (Mg), calcium (Ca), barium (Ba), strontium (Sr), antimony (Sb), or tantalum (Ta).

23. The computing device of claim 18, wherein the top dielectric layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

24. The computing device of claim 18, wherein the transistor is above an interconnect that is above a substrate.

25. The computing device of claim 18, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

\* \* \* \* \*